United States Patent [19]
Gerfault

[11] Patent Number: 5,453,717
[45] Date of Patent: Sep. 26, 1995

[54] H-BRIDGE TYPE POWER AMPLIFIER AND ITS BLOCKING MEANS

[75] Inventor: Bertrand Gerfault, Villedieu-la-Blouere, France

[73] Assignee: Thomson-CSF, Paris, France

[21] Appl. No.: 332,865

[22] Filed: Nov. 1, 1994

[30] Foreign Application Priority Data

Nov. 5, 1993 [FR] France .................. 93 13177

[51] Int. Cl.⁶ .............................. H03F 3/217; H03H 7/00
[52] U.S. Cl. ............... 330/146; 330/251; 332/172
[58] Field of Search ................ 330/146, 207 A, 330/251; 332/172, 177, 180, 181; 455/108

[56] References Cited

U.S. PATENT DOCUMENTS 4,366,441 12/1982 Nishimura .
5,003,271 3/1991 Swanson .............................. 330/146 X

FOREIGN PATENT DOCUMENTS 535797 8/1992 European Pat. Off. .
1414293 9/1965 France .
1911109 3/1969 Germany .
1591820 8/1972 Germany .

*Primary Examiner*—James B. Mullins
*Attorney, Agent, or Firm*—Meltzer, Lippe, Goldstein, et al.

[57] ABSTRACT

The invention concerns H-bridge type power amplifiers and their blocking means.

The memory effect of the capacitive impedance of control inputs of each of the two blocking transistors-in the H-bridge is used to block and unblock the amplifier synchronously with the amplifier input signal: a first switch and a semi-conductor element are placed in parallel with each other, in series with each of these control inputs, such that the blocking of the blocking transistor necessitates the opening of the first switch under the control of the blocking signal, and is dependent on the sign of the charge carried by said capacitive impedance; a second switch controlled by the half periods of the input signal only enables the first switch to close and therefore unblocking of the considered blocking transistor for half periods that are not amplified by this blocking transistor.

4 Claims, 3 Drawing Sheets

H-BRIDGE TYPE POWER AMPLIFIER AND ITS BLOCKING MEANS

BACKGROUND OF THE INVENTION

This invention concerns H-bridge type amplifiers and their blocking means.

Power amplifiers, referred to as H-bridge or complete bridges, are frequently used as power modules to make solid state power amplifier devices. Loads on H-bridges in these devices consist of transformer primaries, with the secondaries of these transformers installed in series. H-bridge amplifier device input signals are modulated by blocking or unblocking all or some H-bridges as a function of the signal carrying the information to be transmitted. Some known blocking means block too authoritatively, in other words without synchronizing the modulated signal and the modulating signal, resulting in severe constraints such as switching with current, phase discontinuity, etc.

Other known blocking means do synchronize signals which requires phase detection, synchronization by a D-type trigger circuit followed by amplification. There are consequently a large number of components and, moreover, logic circuits used do not have a good tolerance to the presence of power circuits in their immediate vicinity.

SUMMARY OF THE INVENTION

The purpose of the invention is to avoid, or at least reduce, these disadvantages.

This is done by directly using the H-bridge amplifier device input signal to enable or disable blocking or unblocking H-bridges.

According to the invention, there is provided an H-bridge type power amplifier and its blocking means, the amplifier comprising a fixed potential point, four transistors each with a control electrode, a blocking input, and four transformers respectively associated with the four transistors, each having a secondary winding with a first terminal connected to the control electrode of the associated transistor and a second terminal, two of the second terminals of the four transformers being blocking terminals coupled through the blocking means to the fixed potential point, the blocking means comprising, on the one hand, between each of the two blocking terminals and the fixed potential point, a first switch and a semi-conductor element mounted in parallel, each first switch having a control input coupled to the blocking input, and on the other hand, a second switch associated with each first switch, coupled to the control input of the first switch associated with it, this second switch having a control input coupled to the input of the blocking terminals to which the first switch associated with it is connected.

BRIEF DESCRIPTION OF THE DRAWINGS

This invention will be better understood, and other characteristics will become clear, based on the following description and the related figures.

The same marks are used for the same items on the various figures.

MORE DETAILED DESCRIPTION

Figure 1:
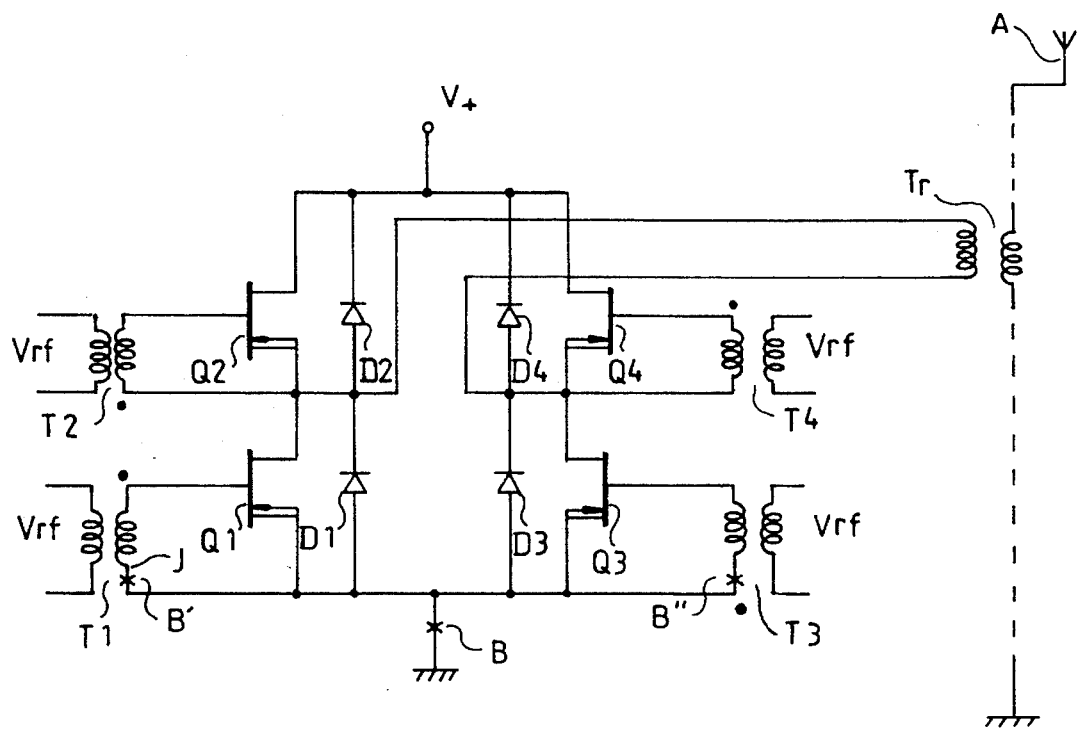
FIG. 1, showing a solid state power amplifier device that may be used with H-bridge blocking means according to the invention, FIGS. 2 and 4, circuit diagrams showing power amplifier blocking devices according to the invention, FIGS. 3 and 5, timing diagrams for the circuit diagrams in FIGS. 2 and 4 respectively.

FIG. 1 is a simplified circuit diagram showing a power amplifier device made of H-bridge type power modules loaded by transformers, Tr, with secondaries placed in series between the ground and a transmission antenna, A; only one of these modules has been shown on FIG. 1. The number of modules in an amplifier device is generally significantly more than one hundred; the modules in any one device may all be strictly identical, or may all be identical except that a small number of them have very low power in order to be able to finely adjust the power output to the antenna by making combinations of modules with different output powers. However, since the modules are made in a similar manner, even when their powers are different, the description of only one is sufficient to explain their operation. Each of these modules receives the same radio frequency input signal, Vrf. All or some of the modules in the device are blocked by a command that depends on an information signal-to be-transmitted, thus modulating and amplifying the Vrf signal before its transmission to the antenna.

The H-bridge amplifier module shown in FIG. 1 includes four identical N-channel MOSFET transistors, Q1 to Q4, mounted in pairs Q1-Q2 and Q3-Q4 between the ground and a dc voltage source V+: Q1 and Q3 sources are connected to the ground, Q1 and Q3 drains are connected to the Q2 and Q4 sources respectively, and the Q2 and Q4 drains are connected to the dc voltage source V+. The secondaries of four transformers T1 to T4 are connected between the source and the grid of transistors Q1 to Q4 respectively, and the input signal Vrf is applied to the primaries of these transformers; transistors Q1, Q4 receive the signal, Vrf, with the same amplitude and the same phase, and transistors Q2, Q3 receive the signal, Vrf, with the same amplitude as for Q1, Q4, but in phase opposition with respect to the signal received by Q1, Q4. Four diodes D1 to D4 are associated with transistors Q1 to Q4 respectively, the anode and cathode of each diode being connected to the source and drain of the transistor with which it is associated.

Transistors in the circuit shown in FIG. 1 operate under switching conditions, transistors Q1 and Q4 amplifying one of the half periods of the signal Vrf while transistors Q2 and Q3 are blocked, and vice versa for the next half period.

The signal Vrf is modulated by acting on the operation of MOSFET transistors; blocking means generally consist of a control circuit B inserted between the point common to the sources of transistors Q1 and Q3, and the ground; modulation may also be done, for example, using blocking means consisting of two control circuits, B', B", one of which is inserted between the source of Q1 and the terminal J of the secondary of T1 opposite to the grid of Q1, and the other between the source of Q3 and the terminal of the secondary of T3 opposite to the grid of Q3; crosses on FIG. 1 mark the positions at which either the single control circuit B, or the two control circuits B' and B", are inserted.

Stop-start controls B' and B" are two identical controls receiving the same signals, therefore since in the rest of the description blocking means will be of type B', B", only the B' circuit will be described.

In order to facilitate understand of the blocking means that will be described below, note firstly that the current in the load of an H-bridge in a power amplifier device such-as that shown in FIG. 1 is imposed by all unblocked H-bridges in the device, and secondly that the load transformer Tr primary for each H-bridge in the device must never be in open circuit to avoid an infinite impedance in the antenna-ground link as shown in FIG. 1.

An H-bridge equipped with blocking means B' B" may be in the normal state or the blocked state; the blocked state is the state in which the H-bridge does not supply any output power since it is blocked by means of blocking means B', B" and the normal state is the state in which blocking means B', B" behave as two short circuits, with the H-bridge as shown in FIG. 1 amplifying signal Vrf "normally". Obviously, problems may occur when changing from one state to the other; the rest of the description will describe how this type of problem can be avoided.

Figure 2:
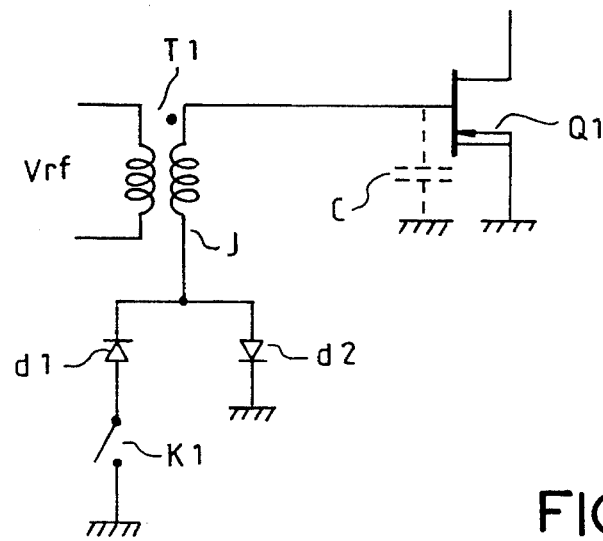

FIG. 2 is a simplified and partial circuit diagram showing the control circuit B' in FIG. 1, as it can be made according to the invention. As seen from the terminal J of the secondary of T1 opposite the grid of Q1, this control circuit includes a first diode d1, in the blocked direction, connected to the ground through a switch K1, and a second diode d2, in the conducting direction, the cathode of which is directly connected to the ground.

The operation of the control circuit shown in FIG. 2 draws profit from the internal capacitance of the grid of the MOSFET transistor, Q1; this capacitance is represented by a capacitor C on FIG. 2. If the H-bridge in FIG. 1 consists of two-pole transistors, in order to obtain the same operating conditions as with MOSFET transistors it would be necessary either to use two-pole transistors Q1, Q3 with MOS input, or to connect a capacitor between the ground and the grid of transistors Q1, Q3. The control circuit in FIG. 2 uses the memory effect that gives transistor Q1 its internal grid capacitance.

With switch K1 closed, the H-bridge is in its normal state with diode d1 conducting while condenser C is being charged, and diode d2 conducting while it is being discharged.

Two cases have to be considered when switch K1 opens, depending on the H-bridge input signal Vrf; either the voltage at the transformer T1 secondary terminals is negative, or it is positive. If it is negative, then transistor Q1 is blocked and since switch K1 is opened as shown on FIG. 2, capacitor C remains charged at a constant negative voltage and transistor Q1 remains blocked. Should the voltage at the terminals of the transformer T1 secondary is positive when switch K1 is opened, the voltage at the terminals of capacitor C is positive and as long it remains positive transistor Q1 is conducting; when the positive voltage due to signal Vrf at the terminals of the secondary of transformer T1 decreases, capacitor C discharges through diode d2 to become negatively charged and blocks Q1 as soon as the voltage at the terminals of the secondary of transformer T1 becomes negative; transistor Q1 then remains blocked since capacitor C, charged negatively, cannot discharge through d1 as long as K1 is open.

Thus transistor Q1 is maintained conducting as long as the voltage at the terminals of the secondary of transformer T1 is positive so that transistor Q1, and therefore the H-bridge, are blocked in synchronization with the input signal Vrf: either the voltage on the transistor Q1 grid is negative and then Q1 is blocked when switch K1 opens and subsequently remains blocked, or this voltage is positive and transistor Q2 remains conducting until the input voltage Vrf changes sign.

Figure 3:
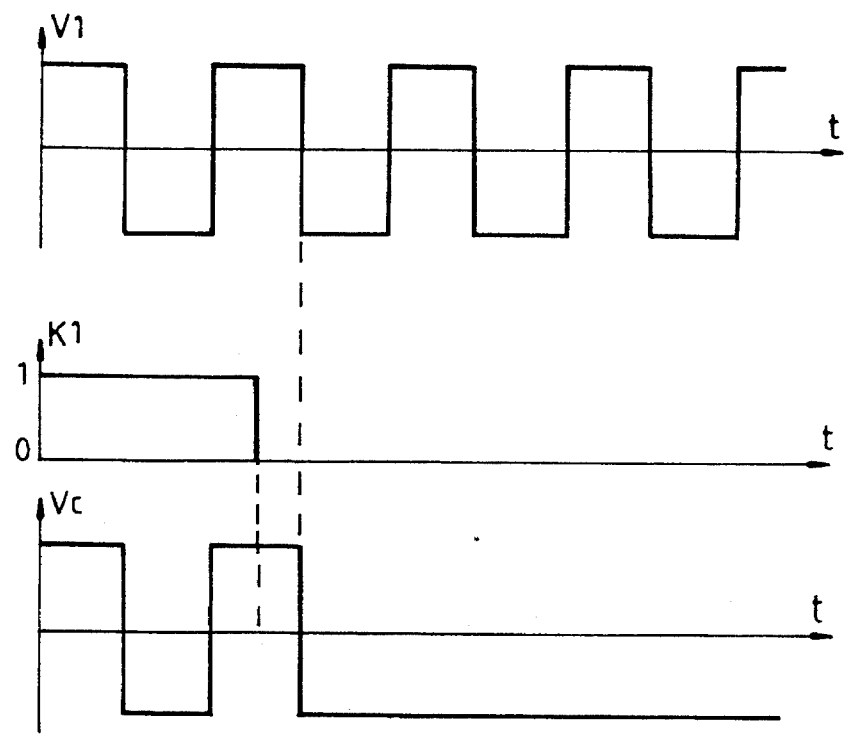

The case in which the voltage at the terminals of the transformer T1 secondary is positive when switch K1 opens is represented in FIG. 3, which shows the closed, 1, and open, 0, states of switch K1 and the voltage Vc at the capacitor C terminals on the same timing diagram.

As described earlier, the blocking control only blocks transistor Q1 when the voltage at the terminals of the secondary of T1 is negative. Concerning the unblocking control for transistor Q1 to change the H-bridge to its normal state, it will have to take place only when the voltage at the terminals of transformer T1 is negative in order to prevent transistor Q1 from switching at a time when it would immediately act as an amplifier because the voltage on its grid is positive, and therefore there would not be any synchronization.

Figure 4:
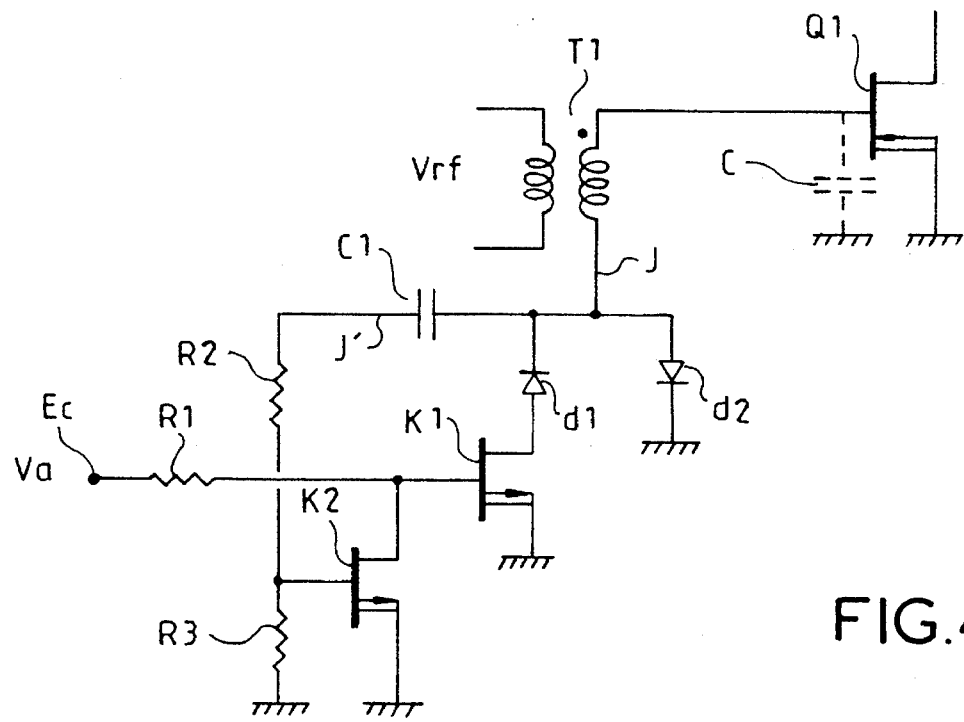

FIG. 4 is an electronic circuit diagram showing blocking means satisfying the criteria described in the previous paragraph.

FIG. 4 corresponds to FIG. 2 extended to ensure unblocking in synchronism with the H-bridge input signal Vrf, and modified to show switch K1 as an electronic switch consisting of a P-channel MOSFET transistor, rather than a simple contact. The drain of transistor K1 is connected to the anode of diode d1, its source is connected to the ground and its grid is coupled through a resistance R1 to the command input Ec of the assembly. To this command input is applied a-signal Va that may have one of two values, 0 or −V, depending on whether the H-bridge must be in the blocked state or in the normal state.

The circuit shown in FIG. 4 further contains a P-channel MOSFET transistor, K2, two resistances R2, R3, and a capacitor C1. The drain of transistor K2 is connected to the grid of transistor K1, and its source is connected to the ground. One of the terminals of capacitor C1 is connected to the terminal J of the secondary of transformer T1; the other terminal, J', of capacitor C1 is connected through resistance R2 to the grid of transistor K2, and this grid is connected to the ground through resistance R3.

The purpose of the assembly shown in FIG. 4 is to keep transistor K1 blocked as long as the voltage on the transformer T1 secondary is positive, in other words as long as the voltage on terminals J and J' is negative; as long as this is the case, the voltage applied to the grid of transistor K2 is negative; therefore this transistor is conducting and connects the grid of transistor K1 to the ground; consequently K1 is blocked even if the control signal Va on the input Ec is equal to −V.

However, if the voltage on the transformer T1 secondary is negative, corresponding to a positive voltage on terminals J and J', then a positive voltage is applied to the transistor K2 grid. This transistor is therefore blocked, which enables transistor K1 to become conducting when the control signal on input Ec is equal to −V corresponding to a command to change the H-bridge to the normal state; and since transistor K1 is conducting, on the one hand transistor Q1 is unblocked and on the other hand the voltage at J and J' cancel to zero thus blocking transistor K2 and locking operation in the normal state for as long as the control signal is equal to −V.

Transistor K2 does not modify operation for changing to the blocked state, as was explained using FIG. 2; in fact, when the blocked state control signal, consisting of a level 0, is applied to the control input Ec, a voltage equal to 0 is immediately applied to the grid of transistor K1, blocking this transistor, regardless of whether transistor K2 is blocked or conducting.

Note that the role of capacitor C1 is to prevent a small positive parasite voltage on terminal J from causing an undesirable changeover from the blocked state to the normal state: due to capacitor C1, the voltage on terminal J' is equal to the average value of the voltage on terminal J and therefore parasites are eliminated.

Figure 5:
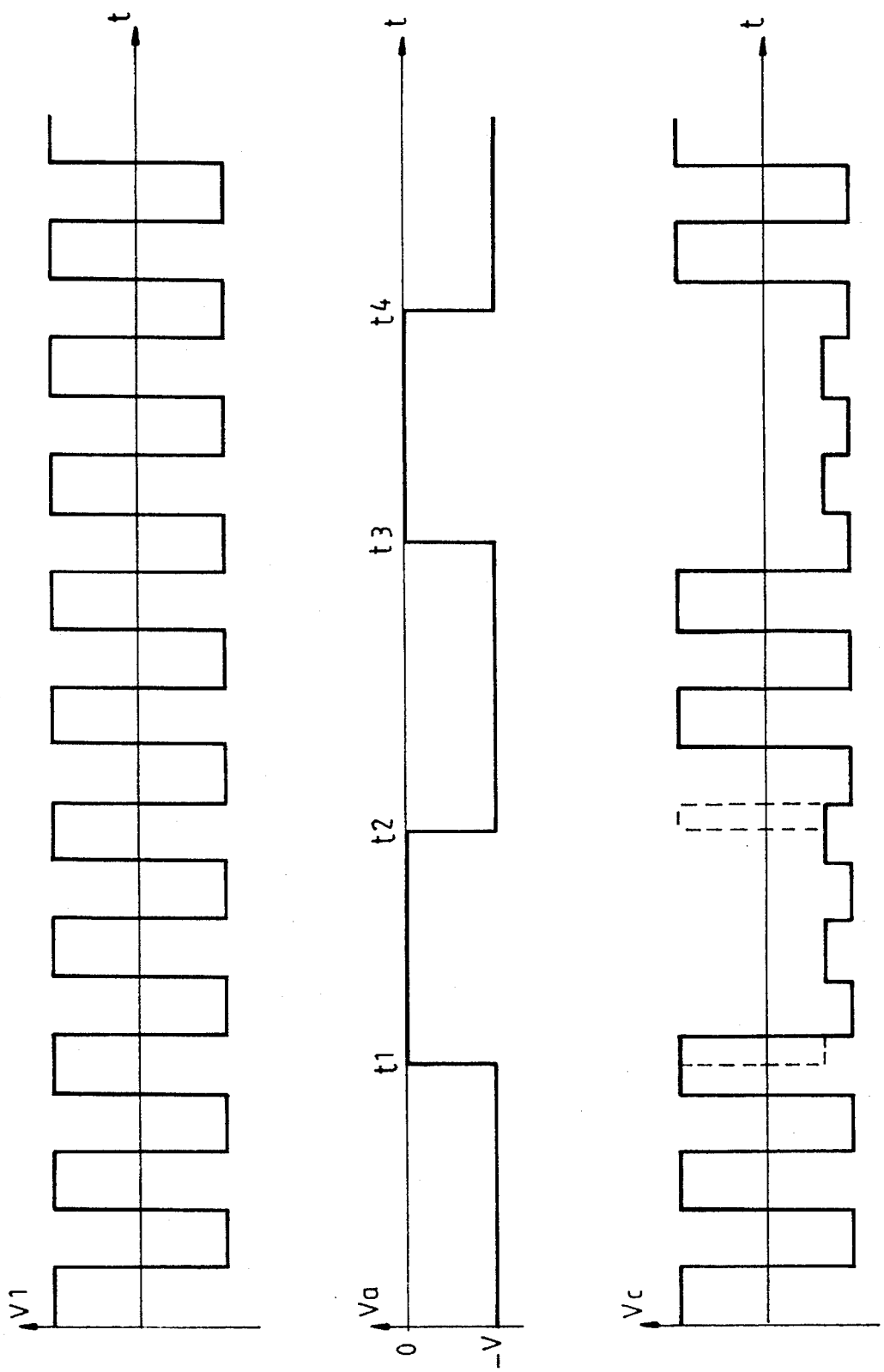

FIG. 5 shows a timing diagram corresponding to that of FIG. 3, in which:

- the state of switch K1 has been replaced by the control signal Va on the control input Ec,
- leakage currents have been taken into account in showing voltage Vc at the terminals of capacitor C,
- four cases of H-bridge control have been shown and also, in dotted lines on the Vc timing diagram, the shape that the curve would have had if blocking and unblocking were not synchronized with voltage V1 on the terminals of the secondary of transformer T1, and therefore with the H-bridge input voltage Vrf.

These four cases of H-bridge control are:

- at t1, triggering a blocked state when the voltage V1 at the terminals of the secondary of transformer T1 is positive; the effective blocking of transistor Q1 is delayed until voltage V1 becomes negative.
- at t2, triggering a normal state when voltage V1 is positive; the effective unblocking of transistor Q1 is delayed until voltage V1 becomes positive;
- at t3 and t4, triggering a blocked state and a normal state respectively, when the voltage V1 at the terminals of transformer t1 is negative; transistor Q1 being blocked by negative voltages V1, synchronization does not cause a problem since the transistor remains blocked after t3 and unblocks after t4 as soon as the voltage V1 becomes positive.

This invention is not restricted to the manufacturing example described above; it is more generally applicable to H-bridges in which blocking means include the following, for each vertical branch of the H-bridge:

- a first switch in parallel on a semi-conductor element, coupled at one end through a transformer secondary in the H-bridge to the control electrode of one of the four transistors in the H-bridge and at the other end to a given potential to put the transistor considered into the conducting state, the control electrode being further coupled to the given potential through a capacitive element,
- a second switch controlled as a function of the signal at the terminals of the secondary considered, to keep the first switch open when the sign of this signal is a given sign.

What is claimed is:

1. An H-bridge type power amplifier and its blocking means, the amplifier comprising a fixed potential point, four transistors each with a control electrode, a blocking input, and four transformers respectively associated with the four transistors, each having a secondary winding with a first terminal connected to the control electrode of the associated transistor and a second terminal, two of the second terminals of the four transformers being blocking terminals coupled through the blocking means to the fixed potential point, the blocking means comprising, on the one hand, between each of the two blocking terminals and the fixed potential point, a first switch and a semi-conductor element mounted in parallel, each first switch having a control input coupled to the blocking input, and on the other hand, a second switch associated with each first switch, coupled to the control input of the first switch associated with it, this second switch having a control input coupled to the input of the blocking terminals to which the first switch associated with it is connected.

2. An amplifier according to claim 1, in which the transistors are MOSFET transistors.

3. An amplifier according to claim 1 in which the first switch consists of the assembly in series of an additional transistor and a diode, the additional transistor having electrodes and in which the control input of the first switch consists of one of the electrodes of the additional transistor.

4. An amplifier according to claim 3 in which the second switch is a transistor with a first and second electrode in series between the control input of the first switch and the fixed potential point, and a third electrode that forms the control input of the second switch.

* * * * *